US012592290B2

(12) United States Patent
Iwasaki et al.

(10) Patent No.: US 12,592,290 B2
(45) Date of Patent: Mar. 31, 2026

(54) MEMORY DEVICES WITH PROGRAM VERIFY LEVELS BASED ON COMPENSATION VALUES

(71) Applicant: MICRON TECHNOLOGY, INC., Boise, ID (US)

(72) Inventors: Tomoko Ogura Iwasaki, San Jose, CA (US); Hong-Yan Chen, San Jose, CA (US); Pamela Castalino, Boise, ID (US); Priya Vemparala Guruswamy, Boise, ID (US); Jun Xu, San Jose, CA (US); Gianluca Nicosia, Boise, ID (US); Ji-Hye Gale Shin, Palo Alto (CA)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 18/239,193

(22) Filed: Aug. 29, 2023

(65) Prior Publication Data

US 2024/0071531 A1 Feb. 29, 2024

Related U.S. Application Data

(60) Provisional application No. 63/402,614, filed on Aug. 31, 2022.

(51) Int. Cl.
*G11C 16/34* (2006.01)
*G11C 16/04* (2006.01)
(Continued)

(52) U.S. Cl.
CPC ...... *G11C 16/3459* (2013.01); *G11C 16/0433* (2013.01); *G11C 16/102* (2013.01); *G11C 16/12* (2013.01)

(58) Field of Classification Search
CPC ............ G11C 16/3459; G11C 16/0433; G11C 16/102; G11C 16/12; G11C 11/5671;
(Continued)

(56) References Cited

U.S. PATENT DOCUMENTS 9,030,870 B2 5/2015 Moschiano et al.
9,177,651 B2 * 11/2015 Sarin .................. G11C 16/3418
(Continued)

OTHER PUBLICATIONS

R. Shirota, Chen-Hao Huang and Hideki Arakawa, "A new disturb free programming scheme in scaled NAND Flash memory," 2011 International Electron Devices Meeting, Washington, DC, USA, 2011 (Year: 2011).*
(Continued)

*Primary Examiner* — Han Yang
*Assistant Examiner* — Christopher Lane Reece
(74) *Attorney, Agent, or Firm* — Dicke, Billig & Czaja, PLLC

(57) ABSTRACT

A memory device includes an array of memory cells and a controller configured to access the array of memory cells to program a selected memory cell of the array of memory cells to a target level based on a compensation value of a program command. The controller is further configured to sense a threshold voltage of the selected memory cell. The controller is further configured to in response to the compensation value having a first value and the threshold voltage being greater than a first program verify level, inhibit programming of the selected memory cell. The controller is further configured to in response to the compensation value having a second value different from the first value and the threshold voltage being greater than a second program verify level less than the first program verify level, inhibit programming of the selected memory cell.

20 Claims, 12 Drawing Sheets

(51) Int. Cl.
*G11C 16/10* (2006.01)
*G11C 16/12* (2006.01)

(58) Field of Classification Search
CPC ............ G11C 16/3427; G11C 11/5628; G11C
16/0483; G11C 16/10
See application file for complete search history.

(56) References Cited

U.S. PATENT DOCUMENTS

| | | | |
|---|---|---|---|
| 9,589,659 B1 | 3/2017 | Vali et al. | |
| 2022/0180940 A1* | 6/2022 | Sharon | H01L 25/18 |
| 2023/0409208 A1* | 12/2023 | Cho | G06F 3/0619 |

OTHER PUBLICATIONS

R. Shirota, Chen-Hao Huang and Hideki Arakawa, "A new disturb free programming scheme in scaled NAND Flash memory," 2011 International Electron Devices Meeting, Washington, DC, USA (Year: 2011).*

* cited by examiner

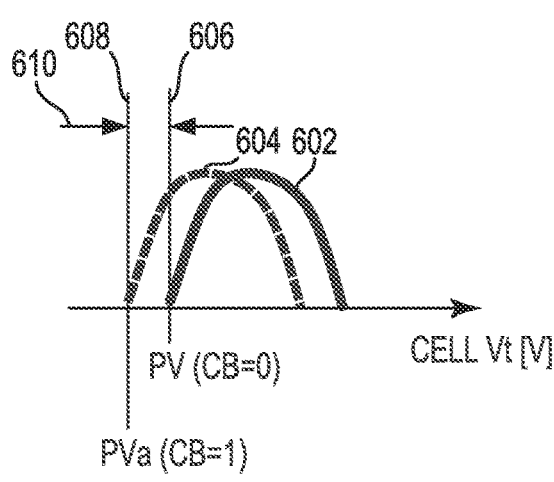
FIG. 6A
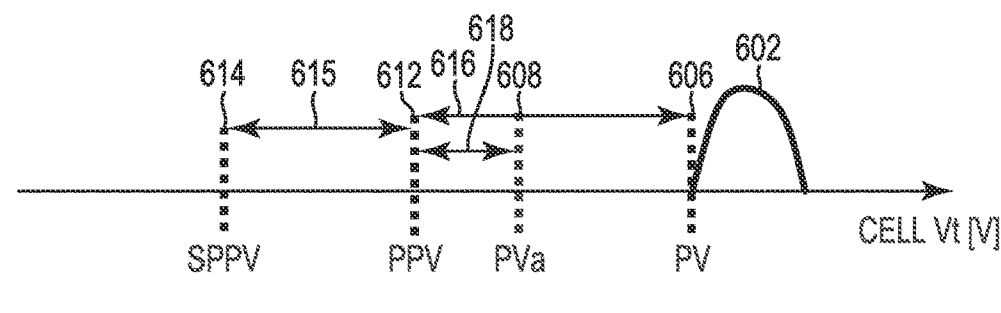
FIG. 6B
FIG. 6C

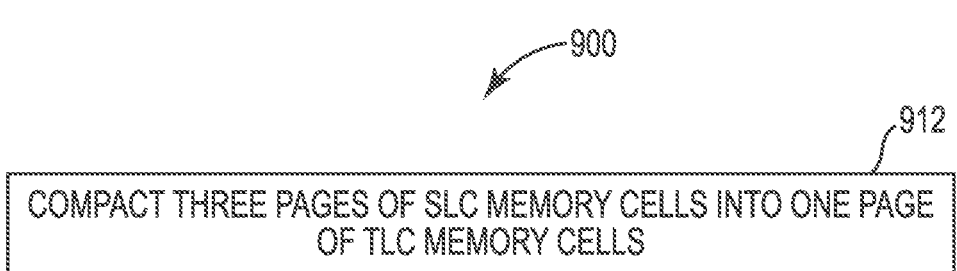

COMPACT THREE PAGES OF SLC MEMORY CELLS INTO ONE PAGE OF TLC MEMORY CELLS — 912

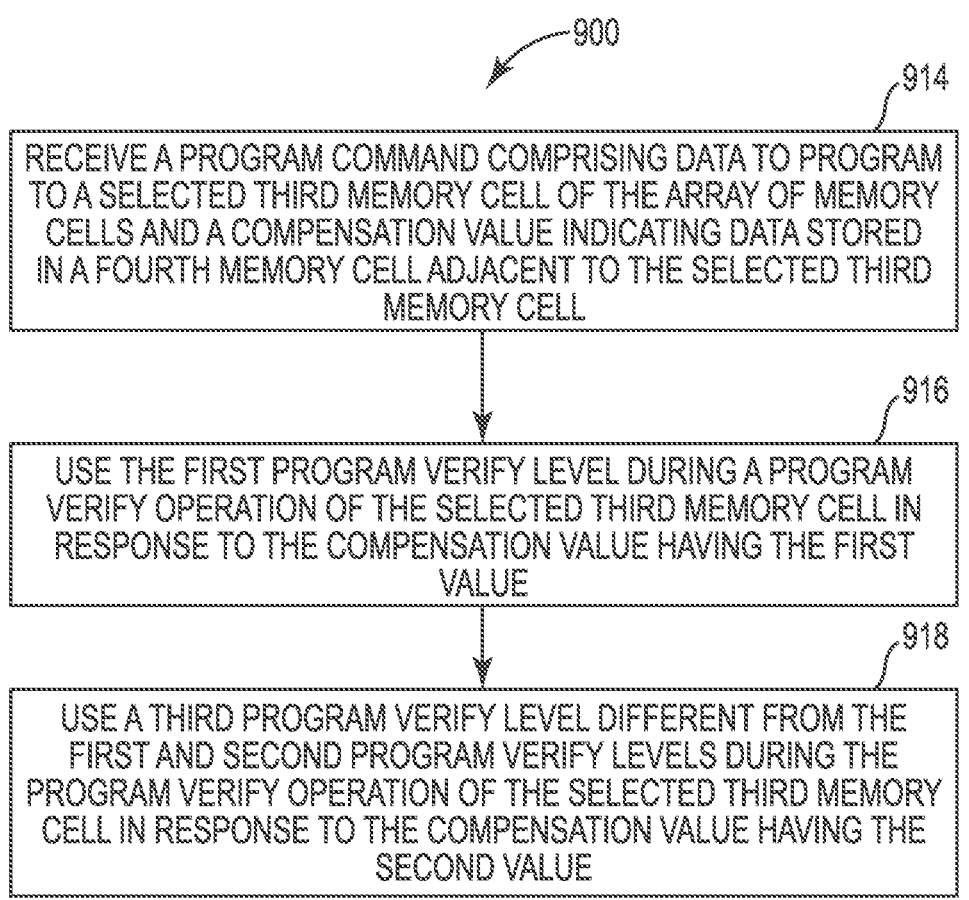

RECEIVE A PROGRAM COMMAND COMPRISING DATA TO PROGRAM TO A SELECTED THIRD MEMORY CELL OF THE ARRAY OF MEMORY CELLS AND A COMPENSATION VALUE INDICATING DATA STORED IN A FOURTH MEMORY CELL ADJACENT TO THE SELECTED THIRD MEMORY CELL — 914

USE THE FIRST PROGRAM VERIFY LEVEL DURING A PROGRAM VERIFY OPERATION OF THE SELECTED THIRD MEMORY CELL IN RESPONSE TO THE COMPENSATION VALUE HAVING THE FIRST VALUE — 916

USE A THIRD PROGRAM VERIFY LEVEL DIFFERENT FROM THE FIRST AND SECOND PROGRAM VERIFY LEVELS DURING THE PROGRAM VERIFY OPERATION OF THE SELECTED THIRD MEMORY CELL IN RESPONSE TO THE COMPENSATION VALUE HAVING THE SECOND VALUE — 918

STORE THE SSPC VALUE IN THE FIRST LATCH IN RESPONSE TO THE
SELECTED MEMORY CELL BEING PROGRAMMED TO AN L1 LEVEL

FIG. 10B

MEMORY DEVICES WITH PROGRAM VERIFY LEVELS BASED ON COMPENSATION VALUES

RELATED APPLICATION

This application claims the benefit of U.S. Provisional Application No. 63/402,614, filed on Aug. 31, 2022, hereby incorporated herein in its entirety by reference.

TECHNICAL FIELD

The present disclosure relates generally to memory and, in particular, in one or more embodiments, the present disclosure relates to using different program verify voltage levels based on compensation values within a memory device.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as a column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) may represent a bit pattern of four bits, and 32-level MLC (typically referred to as PLC) may represent a bit pattern of five bits.

A read window, which may be referred to as a read window width, refers to a distance (e.g., in voltage) between adjacent Vt distributions at a particular bit error rate (BER). A read window budget (RWB) may refer to a cumulative value of read windows for a group of programmed cells (e.g., one or more pages of cells). For example, TLC memory cells configured to store three bits of data per cell may be programmed to one of eight different Vt distributions, each corresponding to a respective data state. In this example, the RWB may be the cumulative value (e.g., in voltage) of the seven read windows between the eight Vt distributions.

BRIEF DESCRIPTION OF THE DRAWINGS

FIG. 6A depicts two possible populations of memory cells during a programming operation to program selected memory cells to a target level according to an embodiment.

FIG. 6B depicts program verify levels used during a programming operation to program selected memory cells to a target level according to an embodiment.

FIG. 6C depicts memory cell populations for a TLC memory and corresponding compensation values according to an embodiment.

FIGS. 9A-9D are flowcharts of a method for programming an array of memory cells in accordance with another embodiment.

FIGS. 10A and 10B are flowcharts of a method for programming an array of memory cells in accordance with another embodiment.

DETAILED DESCRIPTION

Figure 1:
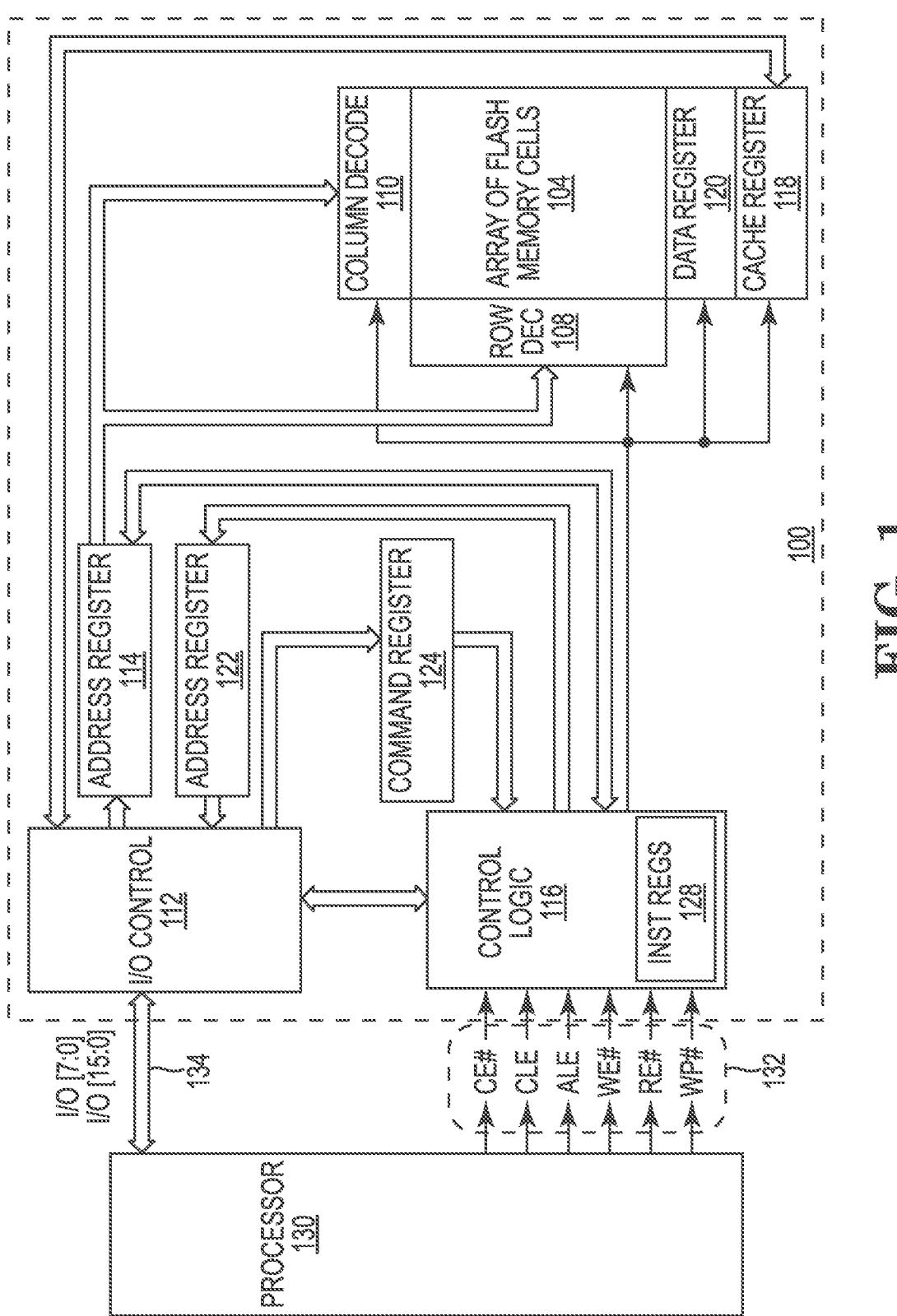
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

Ranges might be expressed herein as from "about" one particular value, and/or to "about" another particular value. When such a range is expressed, another embodiment might include from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

In NAND memory, the threshold voltage of a memory cell may be effectively increased due to the threshold voltage of an adjacent memory cell due to cell-to-cell (C2C) coupling and/or lateral charge migration. For example, a first memory cell connected to a word line WLn and an adjacent second memory cell connected to an adjacent word line WLn+1 might initially be erased (e.g., Vt of about −3V). The first memory cell may then be programmed to a Vt of 2.5V. After programming the first memory cell, the second memory cell may be programmed to a higher Vt of 5V. In this case, for C2C coupling of 2.5%, the effective Vt of the first memory cell becomes 2.7V, which is an increase in 200 mV from the programmed Vt of 2.5V. The C2C coupling ratio increases with a decrease in the distance between adjacent word lines. The C2C coupling may be addressed by using a two-pass programming operation where memory cells connected to a word line WLn are coarsely programmed, then memory cells connected to the adjacent word line WLn+1 are coarsely programmed, and then the memory cells connected to the word line WLn are finely programmed, etc. Alternatively, or in addition, when a read error is uncorrectable due to C2C coupling, a corrective read may be used, which requires an extra read of word line WLn+1 and an additional strobe for word line WLn per level. Two-pass programming operations and corrective reads, however, result in increased latency.

Accordingly, to compensate for C2C coupling and/or lateral charge migration, a single pass programming operation based on a program command including a compensation value is disclosed herein. The compensation value provides an indication of the threshold voltage (e.g., programmed threshold voltage or to be programmed threshold voltage) of the adjacent memory cell so that the threshold voltage of the selected memory cell being programmed may be adjusted to compensate for C2C coupling and/or lateral charge migration. For example, if the compensation value indicates that the adjacent memory cell is programmed (or will be programmed) to a high threshold voltage, the selected memory cell may be programmed to a lower threshold voltage than a target threshold voltage so that the effective threshold voltage is near the target threshold voltage. If the compensation value indicates that the adjacent memory cell is programmed (or will be programmed) to a low threshold voltage, the selected memory cell may be programmed to the target threshold voltage since C2C coupling will not significantly change the effective threshold voltage. Therefore, by pre-compensating for C2C coupling during programming of populations of memory cells, the read window budget (RWB) for the programmed populations of memory cells is improved. Improving the RWB also improves high temperature data retention for the memory. In addition, the memory cells may be over compensated (e.g., by reducing the programmed threshold voltages lower than the threshold voltages used for C2C coupling compensation alone) during programming to also address lateral charge migration.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
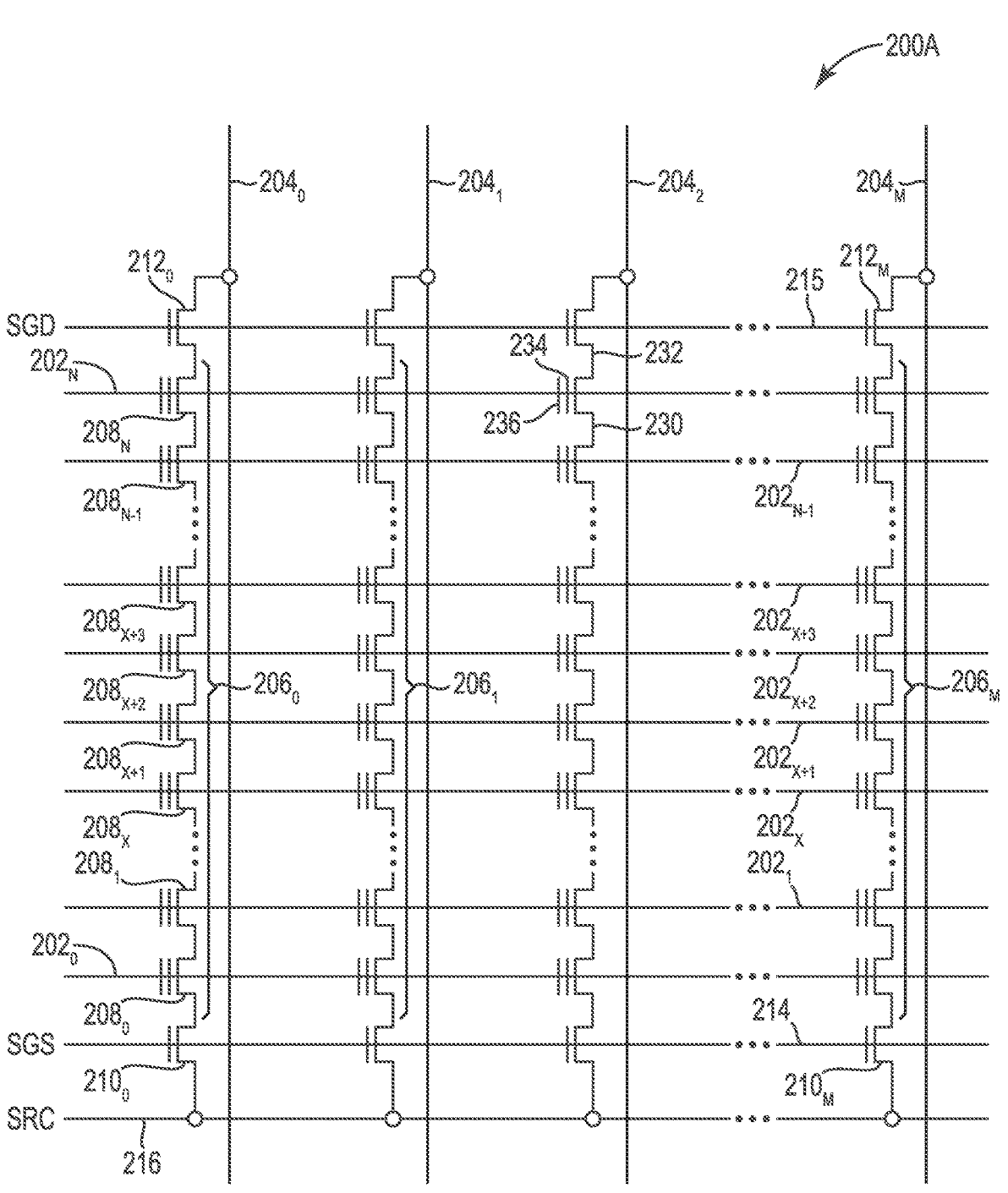
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
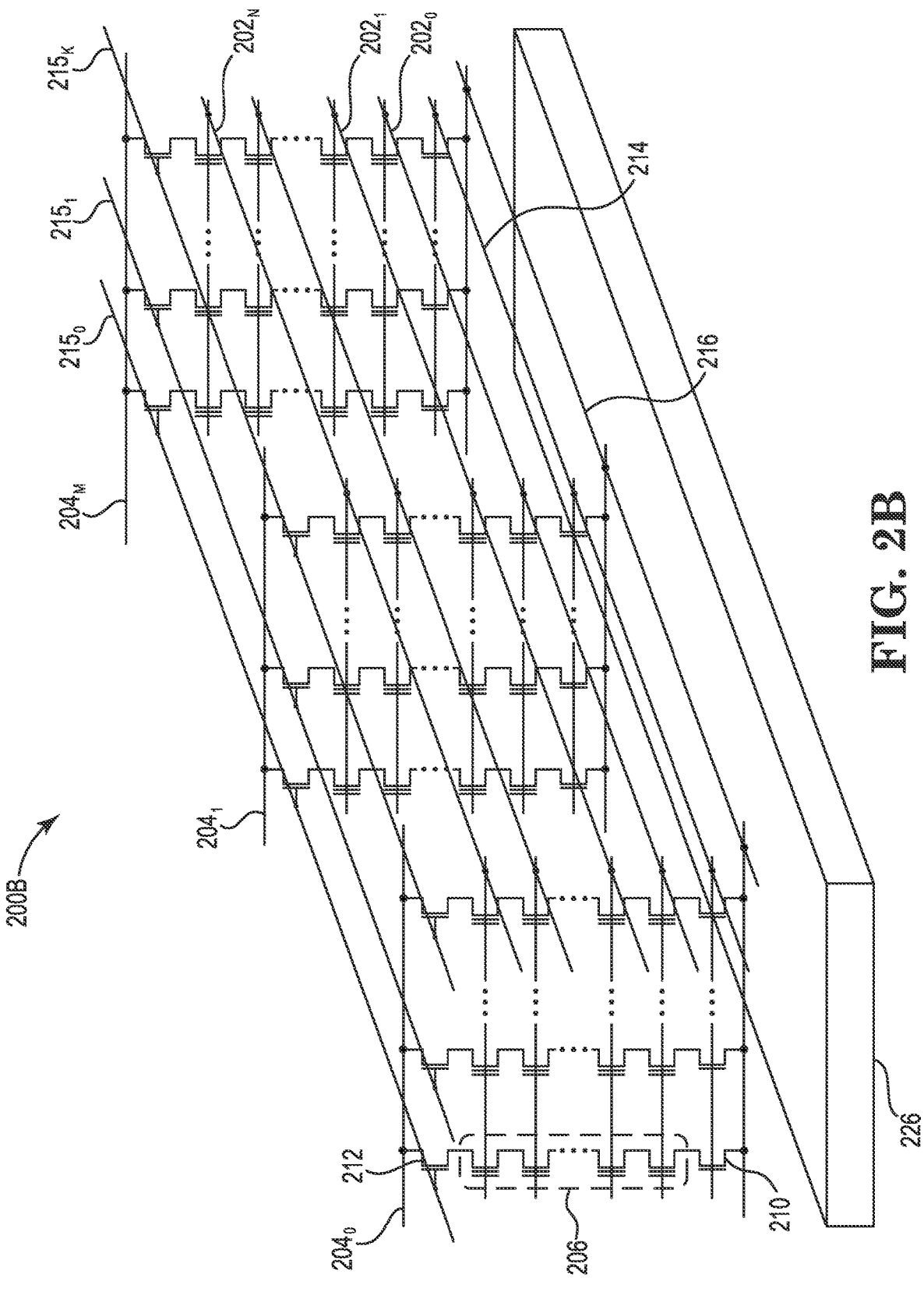

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
Figure 2C:

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204. The buffer portion 240 might also include a plurality of latches 242. Latches 242 might provide at least a portion of data register 120 of FIG. 1. Latches 242 might be used during programming of memory cells to store data values and/or control values (e.g., inhibit, SSPC, DSSPC). For example, for a TLC memory, a first latch might store a compensation value, a second latch might store an inhibit value, a third latch might store extra page data, a fourth latch might store upper page data, and a fifth latch might store lower page data. In some examples, the latches may be shared during a programming operation. For example, a first latch might initially store a compensation value and then store a DSSPC or SSPC value once the L1 target level memory cells have been programmed.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figures 3, 4, 5:
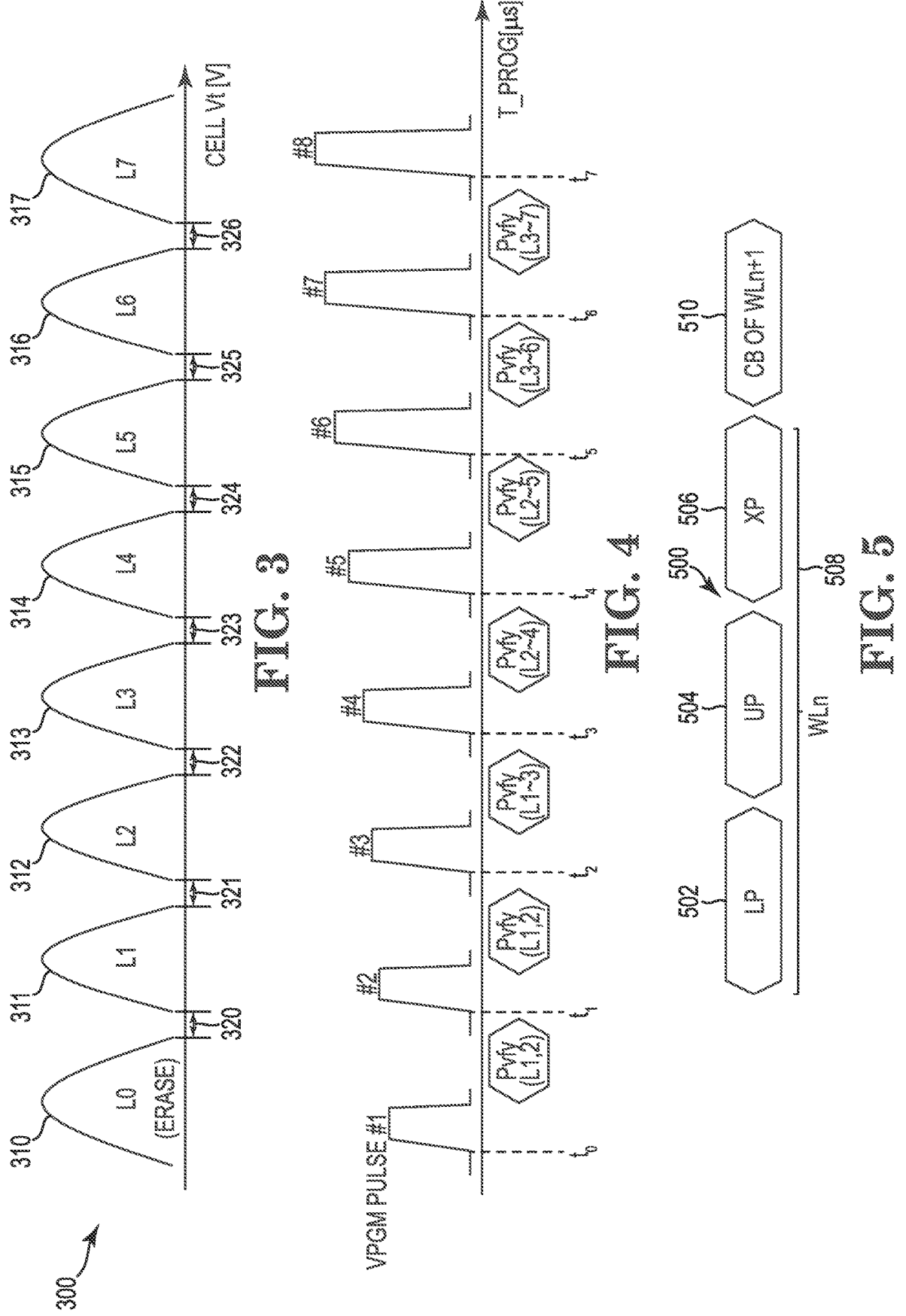
FIG. 3 depicts memory cell populations for a TLC memory after programming according to an embodiment.
FIG. 4 is a timing diagram depicting a portion of a programming operation to program selected TLC memory cells to target threshold voltages according to an embodiment.
FIG. 5 depicts a programming command including compensation values according to an embodiment.

FIG. 3 depicts memory cell populations 300 for a memory according to an embodiment. For simplicity, FIG. 3 and the following FIGS. 4-7C will presume programming operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, programming operations performed on lower storage density memory cells, e.g., SLC (two data states) or higher storage density memory cells, e.g., QLC (16 data states) or PLC (32 data states) memory cells, are equally applicable.

In this example, the population of memory cells 310 might be erased memory cells and represent a logical data value of '111', the population of memory cells 311 might represent a logical data value of '110', the population of memory cells 312 might represent a logical data value of '100', the population of memory cells 313 might represent a logical data value of '000', the population of memory cells 314 might represent a logical data value of '101', the population of memory cells 315 might represent a logical data value of '011', the population of memory cells 316 might represent a logical data value of '001', and the population of memory cells 317 might represent a logical data value of '101', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. Although a specific example of binary representation is provided, embodiments may use other arrangements of bit patterns to represent the various data states.

A read window between the population of memory cells 310 and the population of memory cells 311 is indicated at 320, which is the distance (e.g., in voltage) between adjacent Vt distributions for the memory cells representing data states L0 and L1. A read window between the population of memory cells 311 and the population of memory cells 312 is indicated at 321, which is the distance (e.g., in voltage) between adjacent Vt distributions for the memory cells representing data states L1 and L2. Likewise, a read window between the population of memory cells 312, 313, 314, 315, and 316, and the population of memory cells 313, 314, 315, 316, and 317 is indicated at 322, 323, 324, 325, and 326, respectively, which is the distance between adjacent Vt distributions for the memory cells representing data states L2, L3, L4, L5, L6, and L7. A read window budget (RWB) may refer to a cumulative value of read windows for a group of programmed cells (e.g., one or more pages of cells). In this example, the RWB may be the cumulative value (e.g., in voltage) of the seven read windows 320-326 between the eight Vt distributions.

FIG. 4 is a timing diagram depicting a portion of a programming operation to program selected TLC memory cells to target levels L0 to L7 (e.g., as illustrated in FIG. 3) according to an embodiment. Once a selected memory cell has been programmed to its target level, the memory cell is inhibited from further programming. Prior to time t0, memory cells selected for programming might be erased such that the selected memory cells each have a threshold voltage corresponding to level L0. At time $t_0$, a first program pulse is applied to a selected access line (e.g., 202 of FIG. 2A) connected to the control gates (e.g., 236) of the selected memory cells (e.g., 208). After the first program pulse, a program verify operation may be performed to verify whether a target population of the selected memory cells has been programmed to level L1 or L2. At time $t_1$, a second program pulse, e.g., higher than the first program pulse, is applied to the selected access line connected to the control gates of the selected memory cells. After the second program pulse, a program verify operation may be performed to verify whether target populations of the selected memory cells have been programmed to level L1 or L2.

At time $t_2$, a third program pulse, e.g., higher than the second program pulse, is applied to the selected access line connected to the control gates of the selected memory cells. After the third program pulse, a program verify operation may be performed to verify whether target populations of the selected memory cells have been programmed to level L1, L2, or L3. At time $t_3$, a fourth program pulse, e.g., higher than the third program pulse, is applied to the selected access line connected to the control gates of the selected memory cells. After the fourth program pulse, a program verify operation may be performed to verify whether target populations of the selected memory cells have been programmed to level L2, L3, or L4. At time $t_4$, a fifth program pulse, e.g., higher than the fourth program pulse, is applied to the selected access line connected to the control gates of the selected memory cells. After the fifth program pulse, a program verify operation may be performed to verify whether target populations of the selected memory cells have been programmed to level L2, L3, L4, or L5.

At time $t_5$, a sixth program pulse, e.g., higher than the fifth program pulse, is applied to the selected access line connected to the control gates of the selected memory cells. After the sixth program pulse, a program verify operation may be performed to verify whether target populations of the selected memory cells have been programmed to level L3, L4, L5, or L6. At time $t_6$, a seventh program pulse, e.g., higher than the sixth program pulse, is applied to the selected access line connected to the control gates of the selected memory cells. After the seventh program pulse, a program verify operation may be performed to verify whether target populations of the selected memory cells have been programmed to level L3, L4, L5, L6, or L7. At time $t_7$, an eighth program pulse, e.g., higher than the seventh program pulse, may be applied to the selected access line connected to the control gates of the selected memory cells and the process may repeat until the selected memory cells have been programmed to their target levels.

FIG. 5 depicts a programming command 500 for a TLC memory including compensation values according to an embodiment. Programming command 500 includes lower page data 502, upper page data 504, and extra page data 506 to be programed to memory cells connected to a selected word line (e.g., WLn), such as a selected page of memory cells, as indicated at 508. In addition, as indicated at 510, programming command 500 also includes a plurality of compensation values corresponding to the memory cells connected to the selected word line. Each compensation value is based on the data stored (or to be stored) in the corresponding adjacent memory cells connected to a word line (e.g., WLn+1) adjacent to the selected word line. The program verify level used to program each selected memory cell to its target level is selected based on the corresponding compensation value.

FIG. 6A depicts two possible populations of memory cells during a programming operation to program selected memory cells to a target level according to an embodiment. Population of memory cells 602 indicates memory cells programmed based on a first compensation value (e.g., CB=0), and population of memory cells 604 indicates memory cells programmed based on a second compensation value (e.g., CB=1). The population of memory cells 602 are programmed using a first program verify voltage level (PV) 606, while the population of memory cells 604 are programmed using a second program verify voltage level (PVa) 608 lower than the first program verify voltage level 606. Thus, the second program verify voltage level 608 is offset with respect to the first program verify voltage level 606 by an offset voltage as indicated at 610. In some examples, the offset 610 might be within a range between about 50 mV and about 350 mV, such as 80 mV, 100 mV, or 200 mV.

FIG. 6B depicts program verify levels used during a programming operation to program selected memory cells to a target level according to an embodiment. In this embodiment, the population of memory cells 602 is programmed using PV 606 for memory cells having a compensation value equal to '0'. In addition, the program verify levels include the second program verify level (PVa) 608 for memory cells having a compensation value equal to '1', a pre-program verify level (PPV) 612, and a slow pre-program verify level (SPPV) 614.

The use of different voltage levels on data lines to be enabled for programming might occur in programming schemes known as selective slow programming convergence (SSPC) or dual selective slow programming convergence (DSSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. The target level may correspond to a minimum threshold voltage of PV 602 with the corresponding compensation value equal to '0' or a minimum threshold voltage of PVa 608 with the corresponding compensation value equal to '1'. PV 606 and PVa 608 may be referred to as final program verify levels for the target level. A pre-program verify level (PPV) 612 may be selected to be less than the final program verify level 606 and/or 608 to enable SSPC programming. A slow pre-program verify level (SPPV) 614 may be selected to be less than the pre-program verify level 612 to enable DSSEPDSSPC programming. In some examples, another final pre-program verify level (PVVa), not shown, may be selected to be between SPPV 614 and PPV 612.

During programing of a population of memory cells, after a particular program pulse, a program verify operation is performed to sense the threshold voltage of each memory cell within the population of memory cells. Memory cells having a threshold voltage less than SPPV 614 are biased for non-DSSPC programming. Memory cells having a threshold voltage between SPPV 614 and PPV 612 are biased for DSSPC programming since the memory cells fall within a DSSPC range as indicated at 615. Memory cells having a threshold voltage between PPV 612 and PV 606 and/or PVa 608 are biased for SSPC programming since the memory cells fall within an SSPC range as indicated at 616 and/or 618, respectively. Memory cells having a threshold voltage greater than PV 606 and/or PVa 608 are inhibited from further programming.

With each memory cell within the population of memory cells biased for non-DSSPC programming, DSSPC programming, SSPC programming, or inhibited from programming, a first subsequent program pulse is applied to the population of memory cells. After the first subsequent program pulse, a program verify operation is performed to sense the threshold voltage of each memory cell within the population of memory cells. Memory cells having a threshold voltage less than SPPV 614 are biased for non-DSSPC programming. Memory cells having a threshold voltage between SPPV 614 and PPV 612 are biased for DSSPC programming since the memory cells fall within a DSSPC range as indicated at 615. Memory cells having a threshold voltage between PPV 612 and PV 606 and/or PVa 608 are biased for SSPC programming since the memory cells fall within the SSPC range 616 and/or 618, respectively. Memory cells having a threshold voltage greater than PV 606 and/or PVa 608 are inhibited from further programming and the process repeats until the memory cells have all been programmed to their final target levels.

A memory cell may be biased for DSSPC programming by biasing the data line connected to the memory cell to a DSSPC level during the program pulse. A memory cell may be biased for SSPC programming by biasing the data line connected to the memory cell to a SSPC level during the program pulse. A memory cell may be biased for non- DSSPC and non-SSPC programming by biasing the data line connected to the memory cell to a non-SSPC level during the program pulse. A memory cell may be inhibited from programming by biasing the data line connected to the memory cell to an inhibit level during the program pulse. The SSPC level (e.g., 1V) might be greater than the non-SSPC level (e.g., 0V) and less than the inhibit level (e.g., 3V). The DSSPC level (e.g., 0.5V) might be between the non-SSPC level and the SSPC level.

FIG. 6C depicts memory cell populations 300 for a TLC memory (as previously described and illustrated with reference to FIG. 3) and corresponding compensation values according to an embodiment. In this example, the compensation value (CB) is set equal to '0' if the adjacent memory cell is programmed (or will be programmed) to L0, L1, L2, L3, or L4. That is, the compensation value is set equal to '0' if the adjacent memory cell has (or will have) a threshold voltage less than R5. The compensation value is set equal to '1' if the adjacent memory cell is programmed (or will be programmed) to L5, L6, or L7. That is, the compensation value is set equal to '1' if the adjacent memory cell has (or will have) a threshold voltage greater than R5. In other embodiments, the threshold voltage dividing the compensation value between '0' and '1' may be set to another threshold voltage, such as R4. In this example, CB for a selected WLn may be set based on the lower page data (LP), upper page data (UP), and extra page data (XP) of the adjacent word line WLn+1 as follows:

$$CB = LP*(UP*!XP + !UP*!XP + !UP*XP)$$

where "!" is the NOT operator.

Therefore, selected memory cells including a compensation value of '0' are less effected by C2C coupling and may be programmed using final program verify level PV 606 as illustrated in FIGS. 6A and 6B. Selected memory cells including a compensation value of '1' are more affected by C2C coupling and may be programmed using a final program verify level PVa 608 as illustrated in FIGS. 6A and 6B to compensate for the C2C coupling. By compensating for C2C coupling, the RWB for the populations of memory cells might be improved.

Figure 7A:
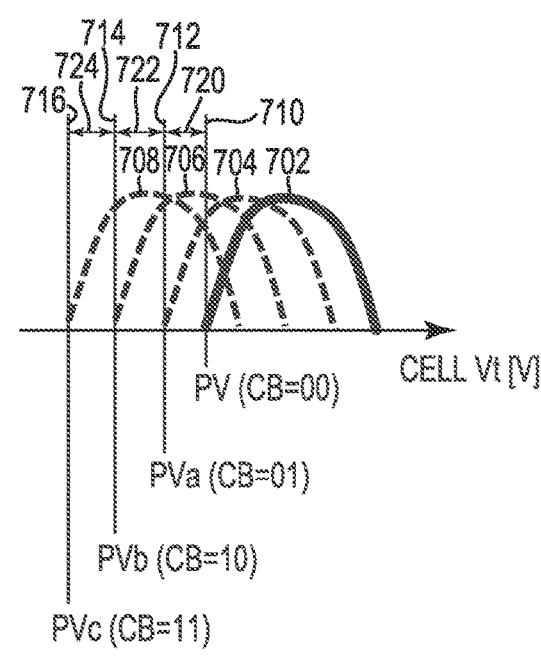
FIG. 7A depicts four possible populations of memory cells during a programming operation to program selected memory cells to a target level according to another embodiment.

FIG. 7A depicts four possible populations of memory cells during a programming operation to program selected memory cells to a target level according to an embodiment. Population of memory cells 702 indicates memory cells programmed based on a first compensation value (e.g., CB=00), population of memory cells 704 indicates memory cells programmed based on a second compensation value (e.g., CB=01), population of memory cells 706 indicates memory cells programmed based on a third compensation value (e.g., CB=10), and population of memory cells 708 indicates memory cells programmed based on a fourth compensation value (e.g., CB=11). The population of memory cells 702 are programmed using a first program verify voltage level (PV) 710, the population of memory cells 704 are programmed using a second program verify voltage level (PVa) 712 lower than the first program verify voltage level 710, the population of memory cells 706 are programmed using a third program verify voltage level (PVb) 714 lower than the second program verify voltage level 712, while the population of memory cells 708 are programmed using a fourth program verify voltage level (PVc) 716 lower than the third program verify voltage level 714. Thus, the second program verify voltage level 712 is offset with respect to the first program verify voltage level 710 by a first offset voltage as indicated at 720, the third program verify voltage level 714 is offset with respect to the second program verify voltage level 712 by a second offset voltage as indicated at 722, and the fourth program verify voltage level 716 is offset with respect to the third program verify voltage level 714 by a third offset voltage as indicated at 724. In some examples, each offset 720, 722, and 724 might be within a range between about 50 mV and about 80 mV. For example, the first offset 720 might be 70 mV, the second offset 722 might be 80 mV, and the third offset 724 might be 50 mV.

Figure 7B:
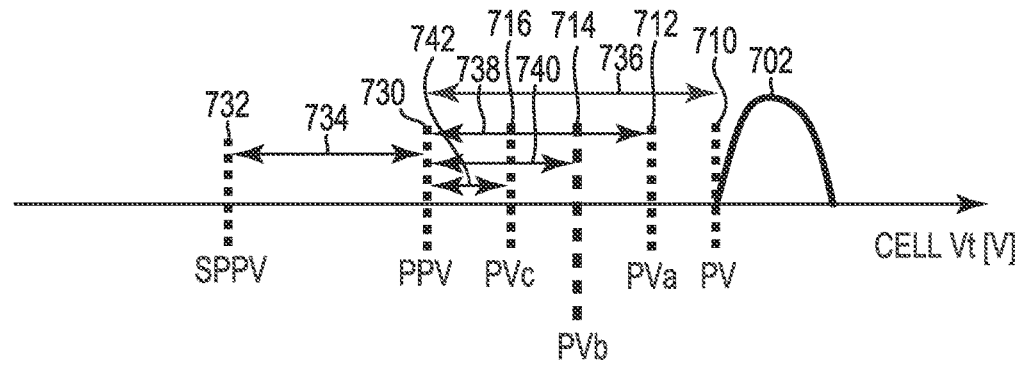
FIG. 7B depicts program verify levels used during a programming operation to program selected memory cells to a target level according to another embodiment.

FIG. 7B depicts program verify levels used during a programming operation to program selected memory cells to a target level according to an embodiment. In this embodiment, the population of memory cells 702 are programmed using PV 710 for memory cells having a compensation value equal to '00'. In addition, the program verify levels include the second program verify level (PVa) 712 in response to a compensation value equal to '01', the third program verify level (PVb) 714 in response to a compensation value equal to '10', the fourth program verify level (PVc) 716 in response to a compensation value equal to '11', a pre-program verify level (PPV) 730, and a slow pre-program verify level (SPPV) 732.

As previously described, the use of different voltage levels on data lines to be enabled for programming might occur in programming schemes known as SSPC or DSSPC, where memory cells nearer to their respective intended data states are programmed more slowly (e.g., partially enabled for programming) compared to memory cells farther from their respective intended data states (e.g., fully enabled for programming) while receiving a same voltage level at their respective control gates. The target level may correspond to a minimum threshold voltage of PV 710 with the corresponding compensation value equal to '00', a minimum threshold voltage of PVa 712 with the corresponding compensation value equal to '01', a minimum threshold voltage of PVb 714 with the corresponding compensation value equal to '10', and a minimum threshold voltage of PVc 716 with the corresponding compensation value equal to '11'. PV 710, PVa 712, PVb 714, and PVc 716 may be referred to as final program verify levels for the target level. A pre-program verify level (PPV) 730 may be selected to be less than the final program verify level 710, 712, 714, and/or 716 to enable SSPC programming. A slow pre-program verify level (SPPV) 732 may be selected to be less than the pre-program verify level 730 to enable DSSPC programming. In some examples, other final pre-program verify levels (PVVa, PVVb, and PVVc), not shown, may be selected to be between SPPV 732 and PPV 730.

During programing of a population of memory cells, after a particular program pulse, a program verify operation is performed to sense the threshold voltage of each memory cell within the population of memory cells. Memory cells having a threshold voltage less than SPPV 732 are biased for non-DSSPC programming. Memory cells having a threshold voltage between SPPV 732 and PPV 730 are biased for DSSPC programming since the memory cells fall within a DSSPC range as indicated at 734. Memory cells having a threshold voltage between PPV 730 and PV 710, PVa 712, PVb 714, and/or PVc 716 are biased for SSPC programming since the memory cells fall within an SSPC range as indicated at 736, 738, 740, and/or 742, respectively. Memory cells having a threshold voltage greater than PV 710, PVa 712, PVb 714, and/or PVc 716 are inhibited from further programming.

With each memory cell within the population of memory cells biased for non-DSSPC programming, DSSPC programming, SSPC programming, or inhibited from programming, a first subsequent program pulse is applied to the population of memory cells. After the first subsequent program pulse, a program verify operation is performed to sense the threshold voltage of each memory cell within the population of memory cells. Memory cells having a threshold voltage less than SPPV 732 are biased for non-DSSPC programming. Memory cells having a threshold voltage between SPPV 732 and PPV 730 are biased for DSSPC programming since the memory cells fall within the DSSPC range as indicated at 734. Memory cells having a threshold voltage between PPV 730 and PV 710, PVa 712, PVb 714, and/or PVc 716 are biased for SSPC programming since the memory cells fall within the SSPC range 736, 738, 740, and/or 742, respectively. Memory cells having a threshold voltage greater than PV 710, PVa 712, PVb 714, and/or PVc 716 are inhibited from further programming and the process repeats until the memory cells have all been programmed to their final target levels.

Figure 7C:
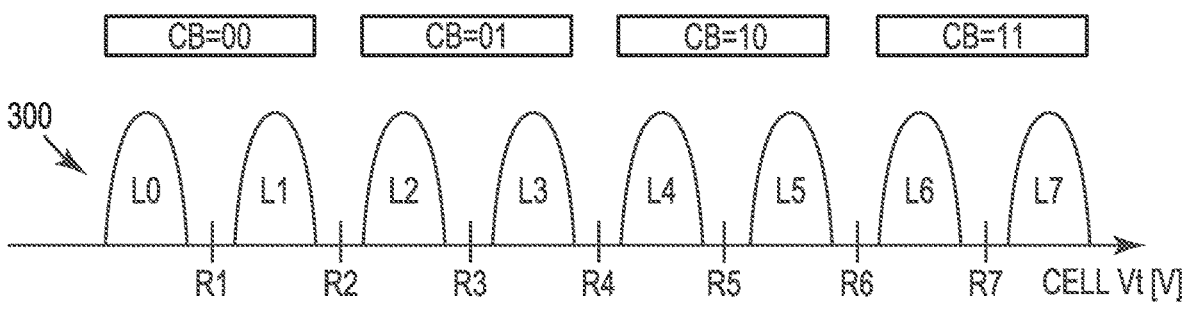
FIG. 7C depicts memory cell populations for a TLC memory and corresponding compensation values according to another embodiment.

FIG. 7C depicts memory cell populations 300 for a TLC memory (as previously described and illustrated with reference to FIG. 3) and corresponding compensation values according to an embodiment. In this example, the compensation value (CB) is set equal to '00' if the adjacent memory cell is programmed (or will be programmed) to L0 or L1. That is, the compensation value is set equal to '00' if the adjacent memory cell has (or will have) a threshold voltage less than R2. The compensation value is set equal to '01' if the adjacent memory cell is programmed (or will be programmed) to L2, L3, or L4. That is, the compensation value is set equal to '01' if the adjacent memory cell has (or will have) a threshold voltage greater than R2 and less than R5. The compensation value is set equal to '10' if the adjacent memory cell is programmed (or will be programmed) to L5. That is, the compensation value is set equal to '10' if the adjacent memory cell has (or will have) a threshold voltage greater than R5 and less than R6. The compensation value is set equal to '11' if the adjacent memory cell is programmed (or will be programmed) to L6 or L7. That is, the compensation value is set equal to '11' if the adjacent memory cell has (or will have) a threshold voltage greater than R6. In other embodiments, the threshold voltage dividing the compensation value between '00', '01', '10', and '11' may be set to other threshold voltages.

Therefore, selected memory cells including a compensation value of '00' are least affected by C2C coupling and may be programmed using final program verify level PV 710 as illustrated in FIGS. 7A and 7B. Selected memory cells including a compensation value of '01' are slightly more affected by C2C coupling and may be programmed using a final program verify level PVa 712 as illustrated in FIGS. 7A and 7B to compensate for the C2C coupling. Selected memory cells including a compensation value of '10' are more affected by C2C coupling and may be programmed using a final program verify level PVb 714 as illustrated in FIGS. 7A and 7B to compensate for the C2C coupling. Selected memory cells including a compensation value of '11' are most affected by C2C coupling and may be programmed using a final program verify level PVc 716 as illustrated in FIGS. 7A and 7B to compensate for the C2C coupling.

Figure 8A:
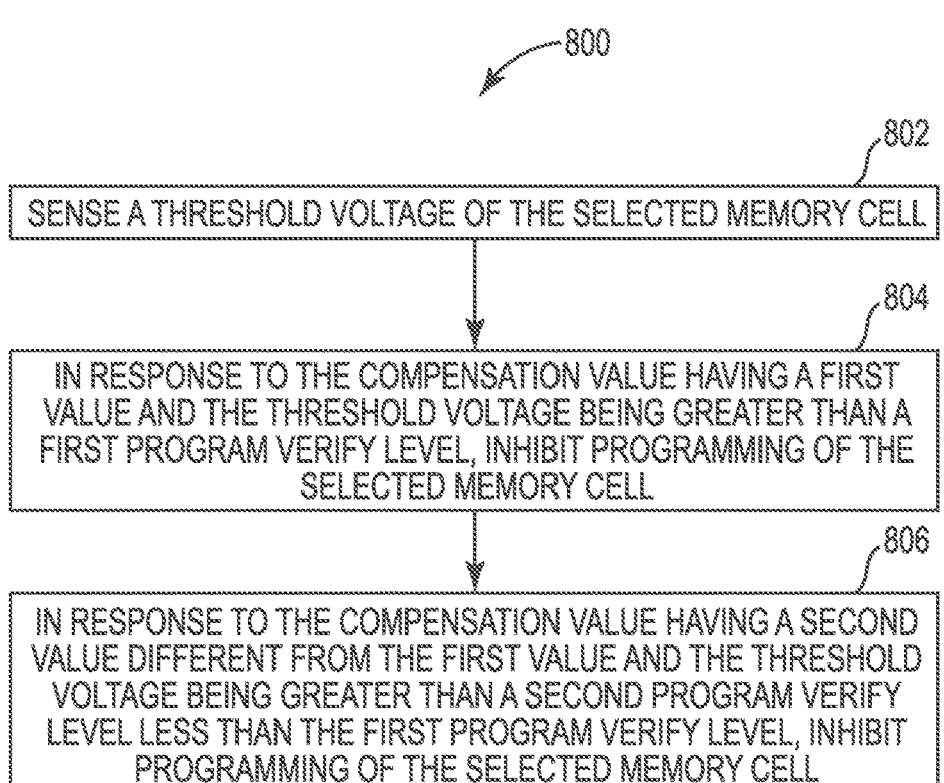
FIGS. 8A and 8B are flowcharts of a method for programming an array of memory cells in accordance with an embodiment.
Figure 8B:
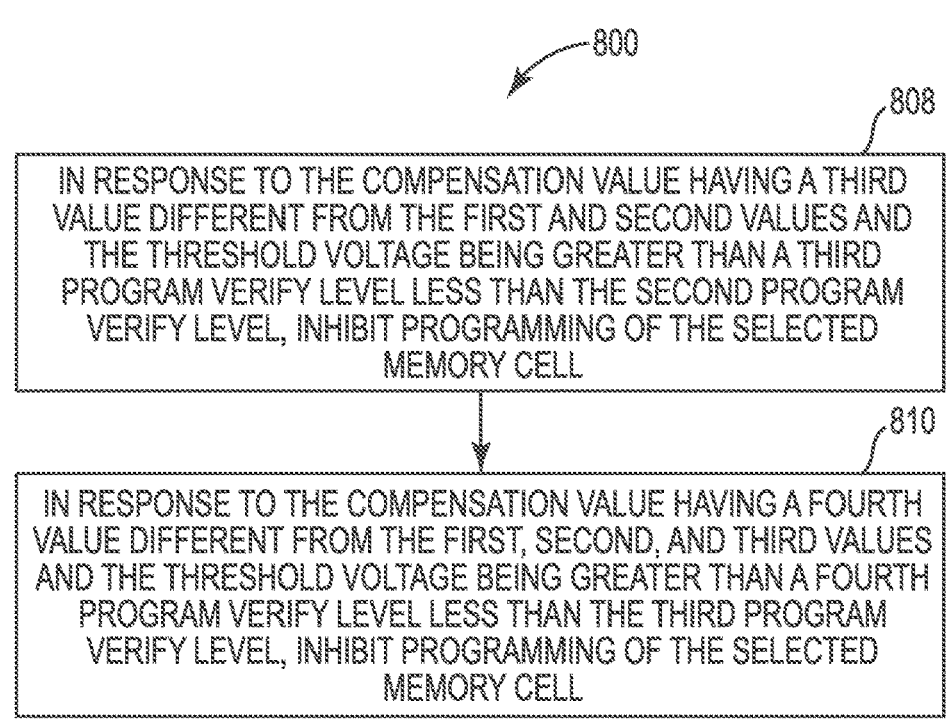

FIGS. 8A and 8B are flowcharts of a method 800 for programming an array of memory cells in accordance with an embodiment. Method 800 may correspond at least in part to FIGS. 3-7C. For example, FIGS. 8A and 8B might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 800 might be implemented within a memory device (e.g., 100) including an array of memory cells (e.g., 104) and a controller (e.g., 116) configured to access the array of memory cells (e.g., TLC memory cells, QLC memory cells, or PLC memory cells) to program a selected memory cell (e.g., 208) of the array of memory cells to a target level based on a compensation value of a program command (e.g., program command 500 of FIG. 5).

As illustrated in FIG. 8A at 802, the controller may sense a threshold voltage of the selected memory cell. At 804, the controller may in response to the compensation value having a first value (e.g., '0', '00') and the threshold voltage being greater than a first program verify level (e.g., 606, 710), inhibit programming of the selected memory cell. At 806, the controller may in response to the compensation value having a second value (e.g., '1', '01') different from the first value and the threshold voltage being greater than a second program verify level (e.g., 608, 712) less than the first program verify level, inhibit programming of the selected memory cell.

In one example, the first value of the compensation value indicates a further memory cell of the array of memory cells adjacent to the selected memory cell is programmed to a first threshold voltage and the second value of the compensation value indicates the further memory cell is programmed to a second threshold voltage greater than the first threshold voltage. In some examples, the second program verify level might be at least 80 mV less than the first program verify level. In some examples, the second program verify level might be selected to compensate for memory cell to memory cell coupling. In this case, the second program verify level might be at least 100 mV less than the first program verify level. In other examples, the second program verify level might be selected to compensate for lateral charge migration. In this case, the second program verify level might be at least 200 mV less than the first program verify level.

As illustrated in FIG. 8B at 808, the controller may further in response to the compensation value having a third value (e.g., '10') different from the first and second values and the threshold voltage being greater than a third program verify level (e.g., 714) less than the second program verify level, inhibit programming of the selected memory cell. At 810, the controller may further in response to the compensation value having a fourth value (e.g., '11') different from the first, second, and third values and the threshold voltage being greater than a fourth program verify level (e.g., 716) less than the third program verify level, inhibit programming of the selected memory cell.

FIGS. 9A-9D are flowcharts of a method 900 for programming an array of memory cells in accordance with another embodiment. Method 900 may correspond at least in part to FIGS. 3-7C. For example, FIG. 9A-9D might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 900 might be implemented within a memory device (e.g., 100) including an array of memory cells (e.g., 104) comprising a plurality of strings (e.g., 206) of series-connected memory cells, a plurality of access lines (e.g.,

202), where each access line is connected to a control gate (e.g., 236) of a respective memory cell (e.g., 208) of each string of series-connected memory cells, and a controller (e.g., 116) configured to access the array of memory cells. The memory device may include a plurality of data lines (e.g., 204), where each data line is selectively connected to a first side of a respective string of series-connected memory cells, and a common source (e.g., 216) selectively connected to a second side of each string of series-connected memory cells.

Figure 9A:
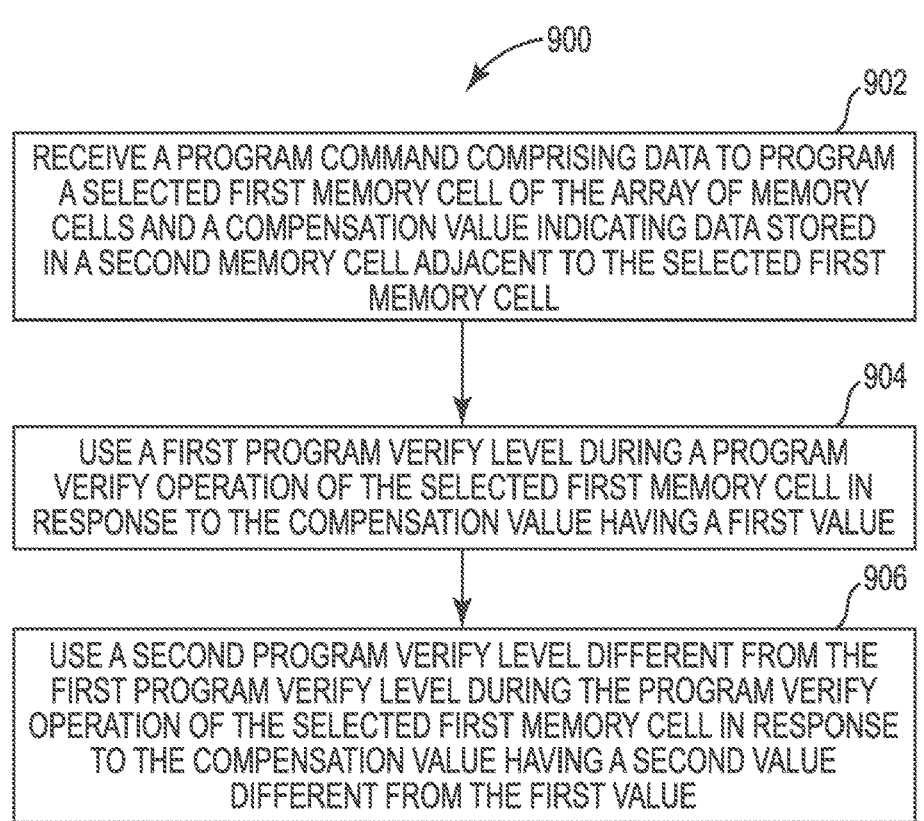

As illustrated in FIG. 9A at 902, the controller may receive a program command (e.g., 500) comprising data to program a selected first memory cell (e.g., 208$_X$) of the array of memory cells and a compensation value indicating data stored in a second memory cell (e.g., 208$_{X+1}$) adjacent to the selected first memory cell. At 904, the controller may use a first program verify level (e.g., 606, 710) during a program verify operation of the selected first memory cell in response to the compensation value having a first value (e.g., '0', '00'). At 906, the controller may use a second program verify level (e.g., 608, 712) different from the first program verify level during the program verify operation of the selected first memory cell in response to the compensation value having a second value (e.g., '1', '01') different from the first value.

In some examples, the first value of the compensation value might indicate the second memory cell is programmed to a first threshold voltage. The second value of the compensation value might indicate the second memory cell is programmed to a second threshold voltage greater than the first threshold voltage. The second program verify level might be less than the first program verify level.

Figure 9B:
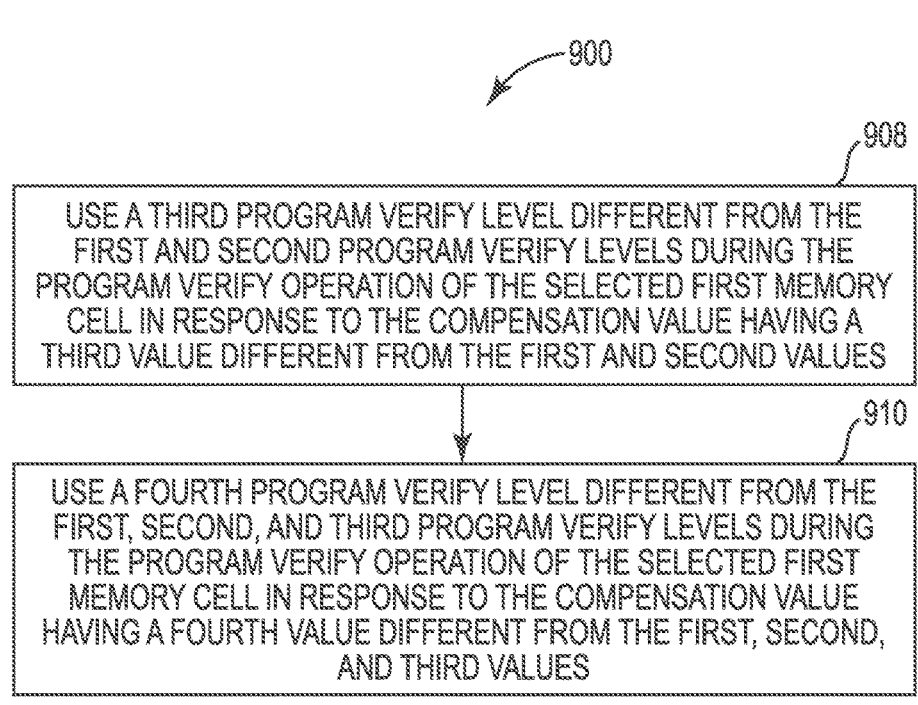

As illustrated in FIG. 9B at 908, the controller may further use a third program verify level (e.g., 714) different from the first and second program verify levels during the program verify operation of the selected first memory cell in response to the compensation value having a third value (e.g., '10') different from the first and second values. At 910, the controller may further use a fourth program verify level (e.g., 716) different from the first, second, and third program verify levels during the program verify operation of the selected first memory cell in response to the compensation value having a fourth value (e.g., '11') different from the first, second, and third values.

In some examples, the first value of the compensation value might indicate the second memory cell is programmed to a first threshold voltage. The second value of the compensation value might indicate the second memory cell is programmed to a second threshold voltage greater than the first threshold voltage. The third value of the compensation value might indicate the second memory cell is programmed to a third threshold voltage greater than the second threshold voltage. The fourth value of the compensation value might indicate the second memory cell is programmed to a fourth threshold voltage greater than the third threshold voltage. The second program verify level might be less than the first program verify level. The third program verify level might be less than the second program verify level, and the fourth program verify level might be less than the third program verify level.

As illustrated in FIG. 9C at 912, the controller may further compact three pages of SLC memory cells into one page of TLC memory cells. In this example, several SLC pages of data are initially programmed to the memory device. These SLC pages may be compacted into TLC pages in a separate target block of memory cells. Prior to word line WLn programming, the three SLC pages associated with word line WLn+1 are read and stored into the page buffers, and logic may be performed in the page buffers to determine the corresponding compensation values for the TLC pages associated with word line WLn. For example, the compensation values where memory cells of word line WLn+1 have a level greater than L4 might be set to '1', and the compensation values where memory cells of word line WLn+1 have a level less than or equal to L4 might be set to '0'. The TLC memory cells associated with word line WLn are then programmed based on the corresponding compensation values.

As illustrated in FIG. 9D at 914, the controller may further receive a program command (e.g., 500) comprising data to program to a selected third memory cell of the array of memory cells and a compensation value indicating data stored in a fourth memory cell adjacent to the selected third memory cell. The selected first memory cell might be connected closer to a respective data line (e.g., 204) of the plurality of data lines than the selected third memory cell. At 916, the controller may further use the first program verify level during a program verify operation of the selected third memory cell in response to the compensation value having the first value. At 918, the controller may further use a third program verify level different from the first and second program verify levels during the program verify operation of the selected third memory cell in response to the compensation value having the second value. This example uses at least two different program verify levels for a single compensation value based on the location of the access line within the array of memory cells. Upper access lines closer to the data lines might have a larger C2C coupling than access lines closer to the common source due to the fabrication process. Accordingly, to address the different C2C coupling, different program verify offsets may be used based on the access line location within the memory array.

Figure 10A:
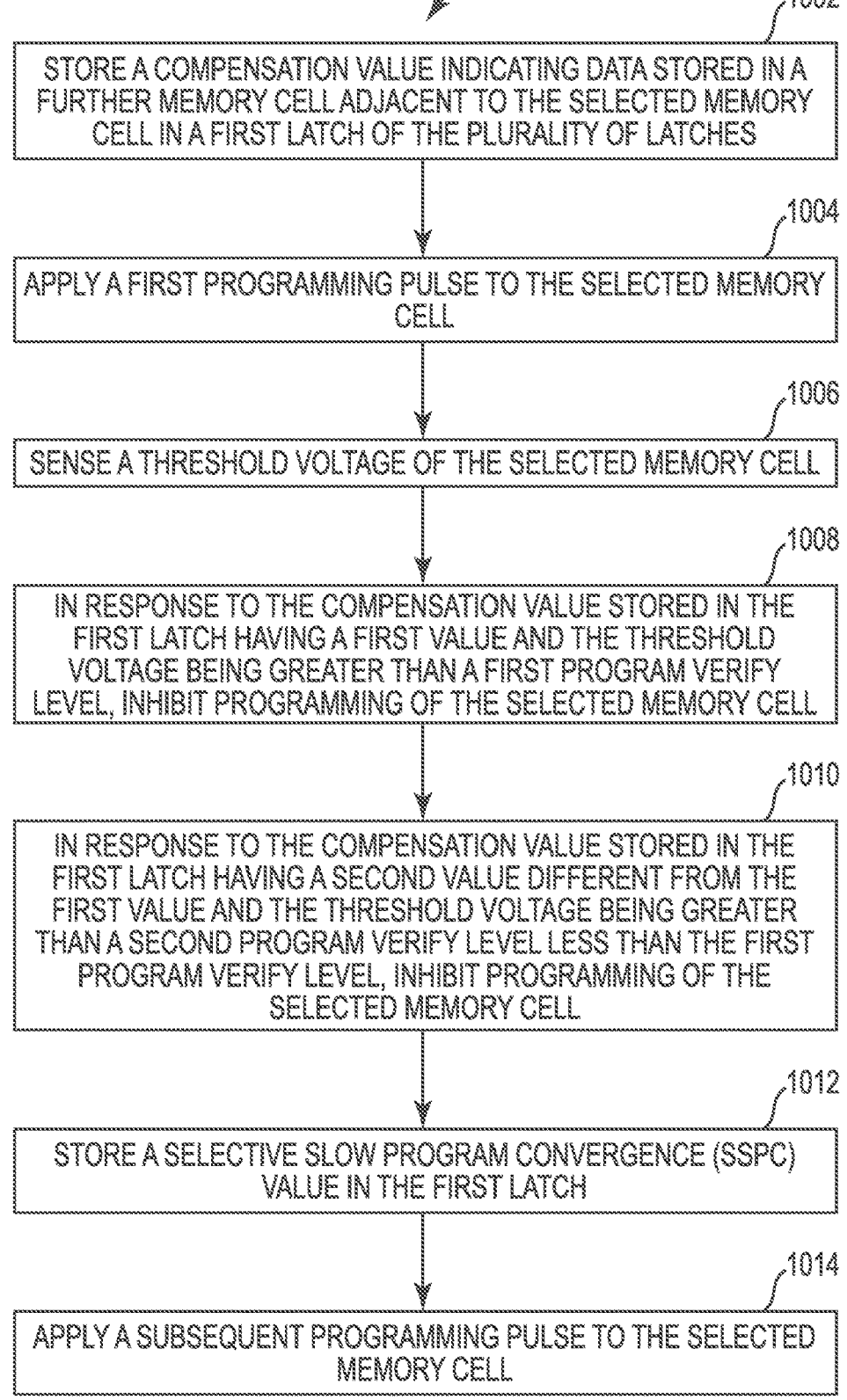
Figure 10B:
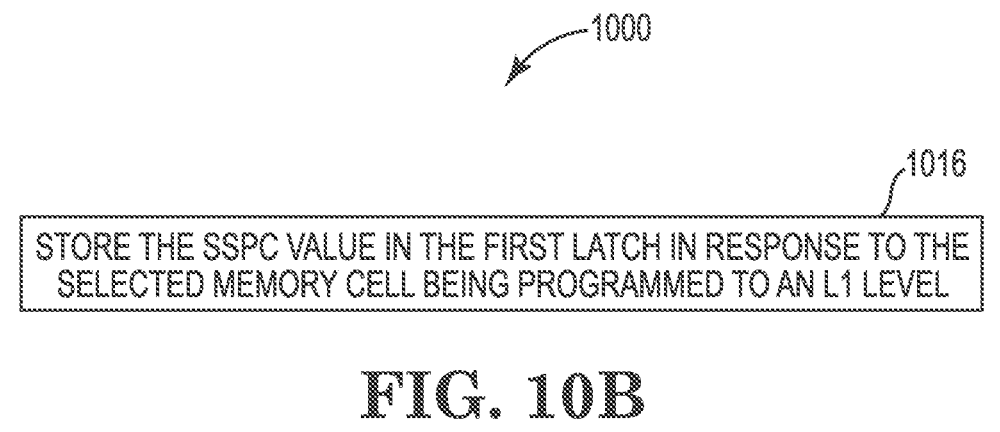

FIGS. 10A and 10B are flowcharts of a method 1000 for programming an array of memory cells in accordance with another embodiment. Method 1000 may correspond at least in part to FIGS. 3-7C. For example, FIGS. 10A and 10B might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 1000 might be implemented within a memory device (e.g., 100) including an array of memory cells (e.g., 104), a page buffer (e.g., 240) connected to the array of memory cells, where the page buffer includes a plurality of latches (e.g., 242), and a controller (e.g., 116) configured to access the array of memory cells (e.g., TLC memory cells, QLC memory cells, or PLC memory cells) to program a selected memory cell (e.g., 208) of the array of memory cells to a target level based on a compensation value.

As illustrated in FIG. 10A at 1002, the controller may store a compensation value indicating data stored in a further memory cell adjacent to the selected memory cell in a first latch of the plurality of latches. At 1004, the controller may apply a first programming pulse to the selected memory cell. At 1006, the controller may sense a threshold voltage of the selected memory cell. At 1008, the controller may in response to the compensation value stored in the first latch having a first value (e.g., '0') and the threshold voltage being greater than a first program verify level (e.g., 606), inhibit programming of the selected memory cell. At 1010, the controller may in response to the compensation value stored in the first latch having a second value (e.g., '1') different from the first value and the threshold voltage being greater than a second program verify level (e.g., 608) less than the first program verify level, inhibit programming of the selected memory cell. At 1012, the controller may store a selective slow program convergence (SSPC) value in the first latch. At 1014, the controller may apply a subsequent programming pulse to the selected memory cell.

As illustrated in FIG. 10B at 1016, the controller may further store the SSPC value in the first latch in response to the selected memory cell being programmed to an L1 level. In some examples, the first value of the compensation value might indicate the further memory cell is programmed to a first threshold voltage and the second value of the compensation value might indicate the further memory cell is programmed to a second threshold voltage greater than the first threshold voltage.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
an array of memory cells; and
a controller configured to access the array of memory cells to program a selected memory cell of the array of memory cells to a target level based on a compensation value included within a program command for the selected memory cell, the compensation value selected from a first value and a second value different from the first value, wherein the first value is selected in response to a further memory cell of the array of memory cells adjacent to the selected memory cell being programmed to or will be programmed to a first level or a second level greater than the first level, and wherein the second value is selected in response to the further memory cell being programmed to or will be programmed to a third level greater than the second level or a fourth level greater than the third level,
wherein the controller is further configured to:
sense a threshold voltage of the selected memory cell;
in response to the compensation value having the first value and the threshold voltage being greater than a first program verify level, inhibit programming of the selected memory cell; and
in response to the compensation value having the second value and the threshold voltage being greater than a second program verify level less than the first program verify level, inhibit programming of the selected memory cell.

2. The memory device of claim 1, wherein the first value of the compensation value indicates the further memory cell is programmed to a first threshold voltage and the second value of the compensation value indicates the further memory cell is programmed to a second threshold voltage greater than the first threshold voltage.

3. The memory device of claim 1, wherein the second program verify level is at least 80 mV less than the first program verify level.

4. The memory device of claim 1, wherein the second program verify level is selected to compensate for memory cell to memory cell coupling.

5. The memory device of claim 4, wherein the second program verify level is at least 100 mV less than the first program verify level.

6. The memory device of claim 1, wherein the second program verify level is selected to compensate for lateral charge migration.

7. The memory device of claim 6, wherein the second program verify level is at least 200 mV less than the first program verify level.

8. The memory device of claim 1, wherein each memory cell of the array of memory cells comprises a TLC memory cell.

9. The memory device of claim 1, wherein the controller is further configured to:

use the first program verify level during a program verify operation of the selected memory cell in response to the compensation value having the first value; and use the second program verify level during the program verify operation of the selected memory cell in response to the compensation value having the second value.

10. The memory device of claim 1, wherein the first value is selected in response to the further memory cell being programmed to or will be programmed to the first level, the second level, or a fifth level greater than the second level and less than the third level.

11. The memory device of claim 1, wherein the second value is selected in response to the further memory cell being programmed to or will be programmed to the third level, the fourth level, or a sixth level greater than the fourth level.

12. A memory device comprising:

an array of memory cells; and a controller configured to access the array of memory cells to program a selected memory cell of the array of memory cells to a target level based on a compensation value included within a program command for the selected memory cell, the compensation value selected from a first value, a second value different from the first value, a third value different from the first and second values, and a fourth value different from the first, second, and third values, wherein the first value is selected in response to a further memory cell of the array of memory cells adjacent to the selected memory cell being programmed to or will be programmed to a first level or a second level greater than the first level, and wherein the second value is selected in response to the further memory cell being programmed to or will be programmed to a third level greater than the second level or a fourth level greater than the third level, wherein the controller is further configured to:

sense a threshold voltage of the selected memory cell;

in response to the compensation value having the first value and the threshold voltage being greater than a first program verify level, inhibit programming of the selected memory cell; and in response to the compensation value having the second value and the threshold voltage being greater than a second program verify level less than the first program verify level, inhibit programming of the selected memory cell.

13. The memory device of claim 12, wherein the third value is selected in response to the further memory cell being programmed to or will be programmed to a fifth level greater than the fourth level, and wherein the fourth value is selected in response to the further memory cell being programmed to or will be programmed to a sixth level greater than the fifth level or a seventh level greater than the sixth level, and wherein the controller is further configured to:

in response to the compensation value having the third value and the threshold voltage being greater than a third program verify level less than the second program verify level, inhibit programming of the selected memory cell; and in response to the compensation value having the fourth value and the threshold voltage being greater than a fourth program verify level less than the third program verify level, inhibit programming of the selected memory cell.

14. The memory device of claim 12, wherein the first value of the compensation value indicates the further memory cell is programmed to a first threshold voltage and the second value of the compensation value indicates the further memory cell is programmed to a second threshold voltage greater than the first threshold voltage.

15. The memory device of claim 12, wherein the second program verify level is selected to compensate for memory cell to memory cell coupling.

16. The memory device of claim 15, wherein the second program verify level is at least 100 mV less than the first program verify level.

17. The memory device of claim 12, wherein the second program verify level is selected to compensate for lateral charge migration.

18. The memory device of claim 12, wherein each memory cell of the array of memory cells comprises a TLC memory cell.

19. The memory device of claim 12, wherein the controller is further configured to:

use the first program verify level during a program verify operation of the selected memory cell in response to the compensation value having the first value; and use the second program verify level during the program verify operation of the selected memory cell in response to the compensation value having the second value.

20. The memory device of claim 19, wherein the controller is further configured to:

use a third program verify level different from the first and second program verify levels during the program verify operation of the selected memory cell in response to the compensation value having the third value; and use a fourth program verify level different from the first, second, and third program verify levels during the program verify operation of the selected memory cell in response to the compensation value having the fourth value.

* * * * *